US009459135B2

(12) United States Patent
Kirita et al.

(10) Patent No.: US 9,459,135 B2
(45) Date of Patent: Oct. 4, 2016

(54) COVER FOR LOAD DETECTION SENSOR AND LOAD DETECTION DEVICE

(71) Applicant: Aisin Seiki Kabushiki Kaisha, Kariya-shi (JP)

(72) Inventors: Tetsuro Kirita, Toyota (JP); Hisayoshi Okuya, Nishio (JP)

(73) Assignee: AISIN SEIKI KABUSHIKI KAISHA, Kariya-shi (JP)

( * ) Notice: Subject to any disclaimer, the term of this patent is extended or adjusted under 35 U.S.C. 154(b) by 101 days.

(21) Appl. No.: 14/572,978

(22) Filed: Dec. 17, 2014

(65) Prior Publication Data

US 2015/0185067 A1    Jul. 2, 2015

(30) Foreign Application Priority Data

Dec. 26, 2013   (JP) .................................. 2013-269382

(51) Int. Cl.
| | |
|---|---|
| *G01G 19/12* | (2006.01) |
| *B60N 2/44* | (2006.01) |
| *B60R 21/015* | (2006.01) |

(Continued)

(52) U.S. Cl.
CPC ..... *G01G 19/4142* (2013.01); *B60R 21/01516* (2014.10); *G01G 21/28* (2013.01); *H05K 5/0034* (2013.01); *B60N 2/002* (2013.01); *H05K 5/0056* (2013.01); *H05K 9/0024* (2013.01)

(58) Field of Classification Search
CPC ........ H02G 3/32; H02G 3/34; H01R 4/4809; F16B 2001/0064; H05K 5/0034; H05K 5/0026; H05K 5/0056; H05K 9/0026; H05K 9/0035; H05K 9/0049; H05K 9/0022; H05K 9/0024; G01G 19/4142; G01G 21/28; B60N 2/002; B60R 21/01516
See application file for complete search history.

(56) References Cited

U.S. PATENT DOCUMENTS 2,813,709 A * 11/1957 Hyman .................. G01G 3/142
                                                          177/137
3,122,604 A *  2/1964 Cook .................... H01R 4/4809
                                                          174/51

(Continued)

FOREIGN PATENT DOCUMENTS

JP       2009-63494        3/2009

OTHER PUBLICATIONS

Rasul, Jad S., "Printed Wiring Board Technology", Wiley Encyclopedia of Electrical and Electronics Engineering, J. Webster, ed., 1999.*

*Primary Examiner* — Randy W Gibson
(74) *Attorney, Agent, or Firm* — Oblon, McClelland, Maier & Neustadt, L.L.P.

(57) ABSTRACT

A cover for a load detection sensor removably attached to the load detection sensor includes a sheet-shaped strain member, a load input member, a strain detection element, at least one fixing member fixing the strain member to a housing, a cover portion, a side portion being integrally formed with the cover portion, and a clamping portion extending from the side portion and covering a clearance provided between the load input member and the fixing member, the clamping portion cooperating with the cover portion so that the clamping portion and the cover portion sandwich the load detection sensor therebetween. The cover portion includes an opening portion being formed to correspond to the load input member, a cutout portion being formed to correspond to the fixing member, a projection portion protruding from a rim portion of the opening portion and being in contact with a portion of the load detection sensor.

12 Claims, 11 Drawing Sheets

(51) Int. Cl.
  *H05K 5/03* (2006.01)
  *H05K 9/00* (2006.01)
  *G01G 19/414* (2006.01)
  *G01G 21/28* (2006.01)
  *H05K 5/00* (2006.01)
  *B60N 2/00* (2006.01)

(56) References Cited

U.S. PATENT DOCUMENTS

| | | | | |
|---|---|---|---|---|
| 3,810,069 A | * | 5/1974 | Jaconette, Jr. | F16B 37/041 439/97 |
| 3,885,853 A | * | 5/1975 | Reimer | H01R 4/4809 439/391 |
| 4,332,174 A | * | 6/1982 | Suzuki | G01G 3/1404 177/211 |
| 5,218,760 A | * | 6/1993 | Colton | G06F 1/183 29/845 |
| 5,353,201 A | * | 10/1994 | Maeda | H05K 9/0033 174/362 |
| 5,723,826 A | * | 3/1998 | Kitagawa | G01G 3/147 177/210 R |
| 7,048,085 B2 | * | 5/2006 | Lichtinger | B60N 2/002 177/144 |
| 7,487,687 B2 | * | 2/2009 | Sumi | B60N 2/002 73/862.391 |
| 7,555,960 B2 | * | 7/2009 | Nakano | B60N 2/002 73/781 |
| 7,559,249 B2 | * | 7/2009 | Nakano | B60N 2/002 73/781 |
| 7,712,374 B2 | | 5/2010 | Kawabata et al. | |
| 8,212,157 B2 | * | 7/2012 | Ito | G01G 19/4142 177/136 |
| 8,257,105 B2 | * | 9/2012 | Schmidt | H01R 13/508 439/352 |
| 8,258,413 B2 | * | 9/2012 | Ito | G01G 19/4142 177/136 |
| 2003/0227760 A1 | * | 12/2003 | Albayrak | H05K 9/0026 361/800 |
| 2010/0012369 A1 | * | 1/2010 | Pope | H05K 9/0026 174/377 |
| 2010/0061066 A1 | * | 3/2010 | Guan | H05K 9/0028 361/752 |
| 2013/0280968 A1 | * | 10/2013 | Kurita | H01R 4/48 439/863 |

* cited by examiner

COVER FOR LOAD DETECTION SENSOR AND LOAD DETECTION DEVICE

CROSS REFERENCE TO RELATED APPLICATIONS

This application is based on and claims priority under 35 U.S.C. §119 to Japanese Patent Application 2013-269382, filed on Dec. 26, 2013, the entire content of which is incorporated herein by reference.

TECHNICAL FIELD

This disclosure generally relates to a cover for a load detection sensor and a load detection device for a vehicle seat.

BACKGROUND DISCUSSION

A load detection sensor for detecting a load on a vehicle seat by a strain member which changes the shape in accordance with an external load has been developed. According to JP2009-63494A (hereinafter referred to as Patent reference 1), a displacement detection device which can reduce a difference of an output amount from a strain detection element for detecting the change of the shape of a strain member is disclosed. The displacement detection device includes strain gauges which are attached onto the strain member receiving an output of a load input member. The strain gauges output electric signals which correspond to strain occurred by a flexure applied to the strain member in accordance with a load. The displacement detection device connects the strain member with an amplifier device by an upper bracket, a first lower bracket and a second lower bracket. According to Patent reference 1, the strain member is prevented from distorting on the basis of a welding position by welding and fixing respective outer end portions of support portions of the first lower bracket and the second lower bracket to the strain member and by welding and fixing outer end portions of an upper bracket to the strain member.

According to Patent reference 1, the strain gauges and an amplifier board are connected with one another via a flexible board. Connection portions between the strain gauges and the flexible board are protected and covered with coating portions, respectively. However, portions of the flexible board which are not covered with the coating portions may be damaged by a contact when the displacement detection device is handled by an operator, is on transportation or when being mounted to a vehicle seat. Further, the portion of the flexible board which is not covered with the coating portions may be damaged by extraneous materials.

A need thus exists for a cover for a load detection sensor and a load detection device which are not susceptible to the drawback mentioned above.

SUMMARY

According to an aspect of this disclosure, a cover for a load detection sensor removably attached to the load detection sensor includes a sheet-shaped strain member, a load input member penetrating a first main surface of the strain member and a second main surface of the strain member, the load input member receiving a load from a seat for a vehicle, a strain detection element being provided at the first main surface of the strain member, a housing configured to contain an amplifier circuit amplifying a signal from the strain detection element, a flexible board configured to connect the strain detection element and the amplifier circuit, at least one fixing member fixing the strain member to the housing, a cover portion facing the first main surface of the strain member, a side portion being integrally formed with the cover portion and facing a side surface of the strain member, a clamping portion facing the second main surface of the strain member, the clamping portion extending from the side portion toward the housing and covering a clearance provided between the load input member and the fixing member, the clamping portion cooperating with the cover portion so that the clamping portion and the cover portion sandwich the load detection sensor therebetween. The cover portion includes an opening portion being formed to correspond to the load input member, a cutout portion being formed to correspond to the fixing member, and a projection portion protruding from a rim portion of the opening portion and being in contact with a portion of the load detection sensor. The cover portion extends over a clearance provided among the housing, the load input member and the fixing member. The cover for the load detection sensor covers the strain detection element and the flexible board.

According to another aspect of this disclosure, a load detection device including a cover for a load detection sensor removably attached to the load detection sensor includes the load detection sensor including a cover for a load detection sensor removably attached to the load detection sensor includes a sheet-shaped strain member, a load input member penetrating a first main surface of the strain member and a second main surface of the strain member, the load input member receiving a load from a seat for a vehicle, a strain detection element being provided at the first main surface of the strain member, a housing configured to contain an amplifier circuit amplifying a signal from the strain detection element, a flexible board configured to connect the strain detection element and the amplifier circuit, at least one fixing member fixing the strain member to the housing, a cover portion facing the first main surface of the strain member, a side portion being integrally formed with the cover portion and facing a side surface of the strain member, a clamping portion facing the second main surface of the strain member, the clamping portion extending from the side portion toward the housing and covering a clearance provided between the load input member and the fixing member, the clamping portion cooperating with the cover portion so that the clamping portion and the cover portion sandwich the load detection sensor therebetween. The cover portion includes an opening portion being formed to correspond to the load input member, a cutout portion being formed to correspond to the fixing member, and a projection portion protruding from a rim portion of the opening portion and being in contact with a portion of the load detection sensor. The cover portion extends over a clearance provided among the housing, the load input member and the fixing member. The cover for the load detection sensor covers the strain detection element and the flexible board.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

Figure 1:
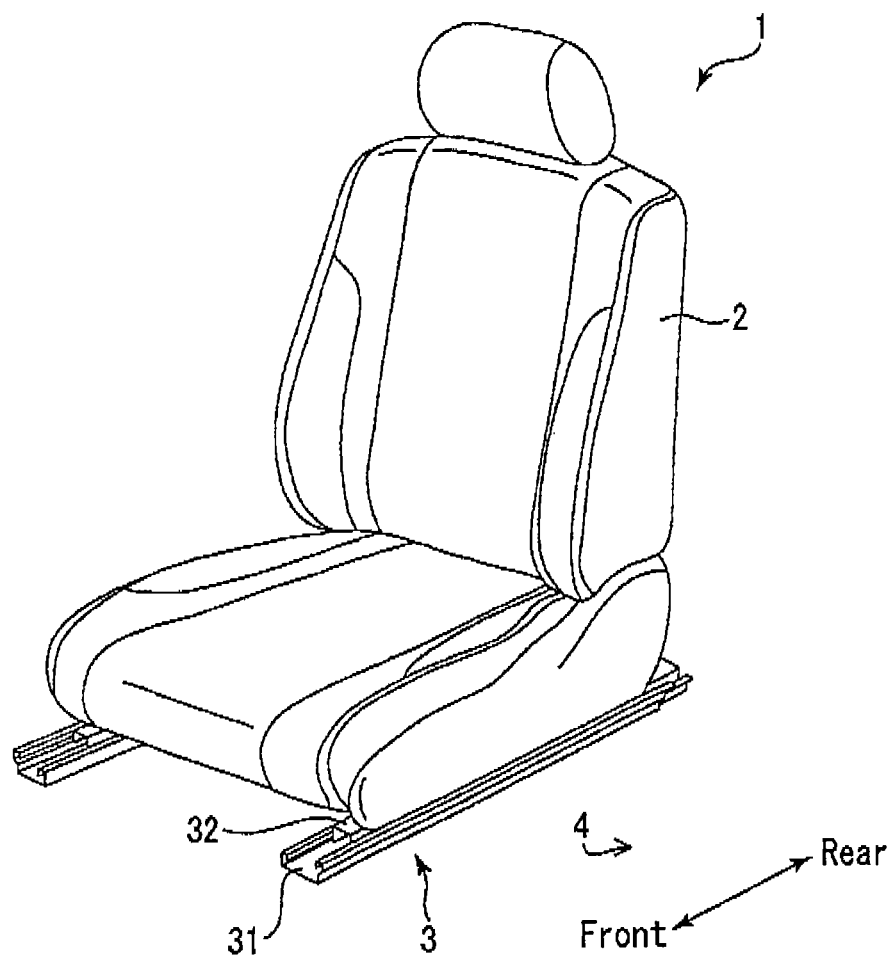
FIG. 1 is a view schematically illustrating a vehicle seat according to an embodiment disclosed here.

An embodiment of this disclosure will be explained with reference to the drawings. As shown in FIG. 1, an arrow indicating frontward and rearward shows a direction seen by an occupant who is seated in a vehicle seat 1. A load detection device with a cover for a load detection sensor is mounted to the vehicle seat 1 to measure a load of an occupant seated in the vehicle seat 1. A seat body 2 of the vehicle seat 1 is slidably mounted to a vehicle by a slide mechanism 3 which is mounted to a floor 4 of a vehicle body.

Figure 2:
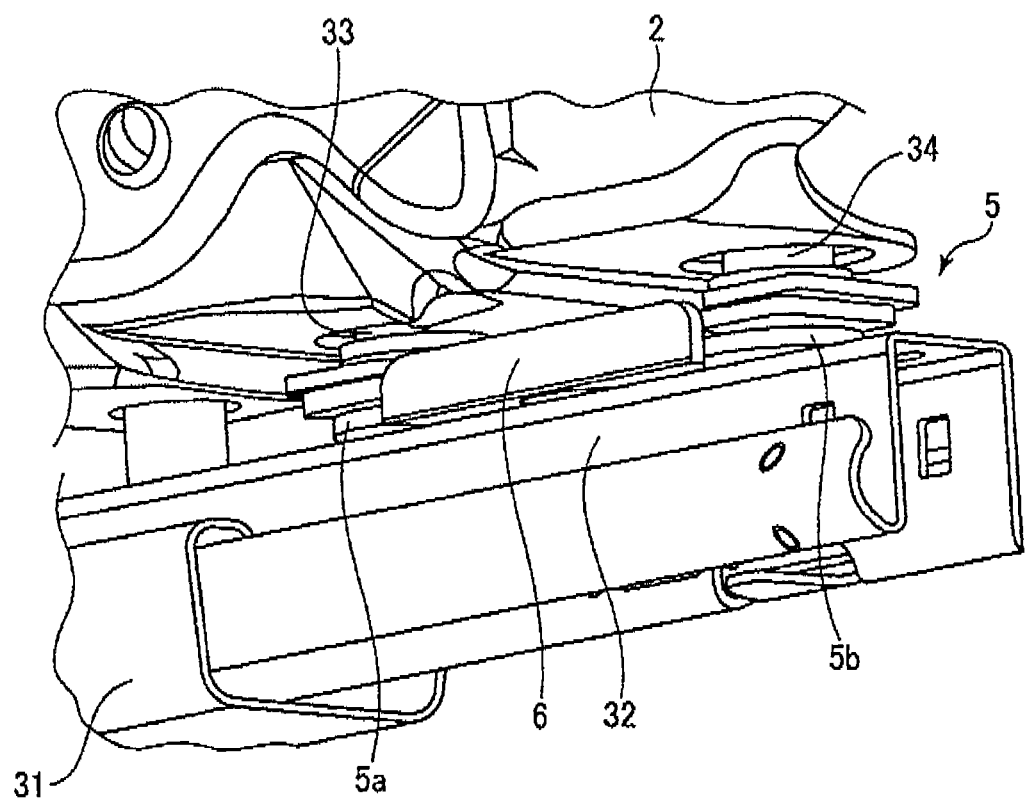
FIG. 2 is a partially enlarged view of a load detection device mounted to a slide mechanism according to the embodiment disclosed here.

The slide mechanism 3 is configured with a pair of lower rails 31 and a pair of upper rails 32. The pair of lower rails 31 is fixed on the floor 4 of the vehicle body and extends in a front-rear direction while the pair of upper rails 32 is slidably supported by the pair of lower rails 31. FIG. 2 shows a load detection device 5 mounted to a front end portion of the upper rail 32. The upper rail 32 includes fixing shafts 33, 34 protruding in a vertical direction or an upward-downward direction and opposing end portions 5a, 5b of the load detection device 5 are fixed on the upper rail 32 by the fixing shafts 33, 34. In addition, the load detection device 5 is provided at a rear end portion of the upper rail 32. The upper rail 32 placed at the rear end portion includes the fixing shafts 33, 34 protruding in the vertical direction and the opposing end portions 5a, 5b of the load detection device 5 are fixed on the upper rail 32 by the fixing shafts 33, 34.

The construction of the load detection device 5 will be explained referring to FIGS. 3 to 6. Hereinafter, a side of the load detection device 5 facing the seat body 2 will be defined as an upward in a case where the load detection device 5 is mounted to the upper rail 32. The load detection device 5 includes a load detection sensor 50 and a cover 6 for the load detection sensor 50 mounted to the load detection sensor 50.

Figure 3:
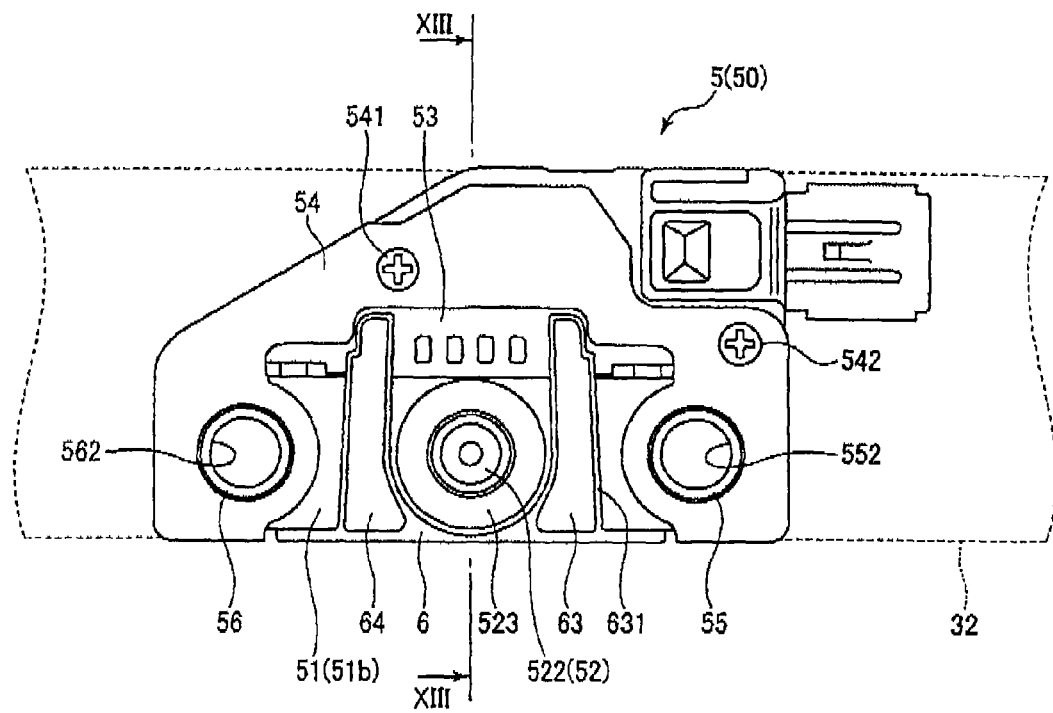
FIG. 3 is a top view of the load detection device of the embodiment.

As shown in FIG. 3, the load detection device 5 is mounted to the upper rail 32 in an extending direction.

The load detection sensor 50 includes a strain member 51, a load input member 52, a housing 53, a housing 53, a connection plate 54, fixing members 55, 56, strain detection elements 57a, 57b, and a flexible board 58. The load input member 52 receives a load applied to the seat body 2. The housing 53 contains an amplifier circuit which amplifies inputted signals. The connection plate 54 connects the strain member 51 and the housing 53. The fixing members 55, 56 fix the strain member 51 with the connection plate 54. The strain detection elements 57a, 57b detect flexure of the strain member 51. The flexible board 58 connects the respective strain detection elements 57a, 57b to the amplifier circuit electrically.

The strain member 51 is formed in a substantially rectangular or quadrilateral sheet-shape and is made from a material having a flexural rigidity, for example, stainless steel. A center portion of the strain member 51 is provided with a hole into which a shaft portion 522 of the load input member 52 is disposed. Opposing end portions of the strain member 51 are provided with through holes for fixing the connection plate 54 to the strain member 51 by the fixing members 55, 56.

The load input member 52 is placed at the center portion of the strain member 51. The load input member 52 is provided with a top portion 521, and the shaft portion 522 protruding from an end of the top portion 521. The shaft portion 522 of the load input member 52 is inserted into the hole from a bottom surface 51a (i.e., serving as a first main surface) of the strain member 51 and protrudes toward an upper surface 51b (i.e., serving as a second main surface) of the strain member 51. The top portion 521 of the load input member 52 comes in contact with the bottom surface 51a of strain member 51. The upper surface 51b of the strain member 51 serving as the second main surface is provided with a bracket 523. The shaft portion 522 of the load input member 52 is fitted by the bracket 523 so that the strain member 51 is interposed between the top portion 521 and the bracket 523. The load input member 52 is mounted and fixed to the seat body 2.

The housing 53 is connected to the strain member 51 via the connection plate 54 so as to be placed at a first side surface of the strain member 51 extending along a longitudinal direction. The connection plate 54 is provided with through holes placed at positions which correspond to the through holes provided at the opposing end portions of the strain member 51. The connection plate 54 is provided with holes for connecting the connection plate 54 to the housing 53, the holes which are placed at predetermined positions to correspond to the housing 53. The connection plate 54 is fixed to the housing 53 by fixing members 541, 542 of, for example, screws, via the holes.

The fixing members 55, 56 fix the connection plate 54 at the opposing end portions of the strain member 51. The fixing member 55 is configured with an annular top portion 551 and a cylinder portion 552. The annular top portion 551 is in contact with the bottom surface 51a of the strain member 51 which serves as the first main surface. The cylinder portion 552 is formed in a cylindrical shape and protrudes and extends from a center portion of the annular top portion 551. The fixing member 56 is configured with an annular top portion 561 and a cylinder portion 562. The annular top portion 561 is in contact with the bottom surface 51a of the strain member 51 which serves as the first main surface. The cylinder portion 562 is formed in a cylindrical shape and protrudes and extends from a center portion of the annular top portion 561. The cylinder portions 552, 562 fit and fix the strain member 51 with the connection plate 54 via the through holes provided at the strain member 51 and via the through holes provided at the connection plate 54. Joining members for mounting the load detection device 5 to the upper rail 32 are positioned within the cylinder portions 552, 562, respectively, to engage the load detection device 5 with the upper rail 32.

Figure 6:
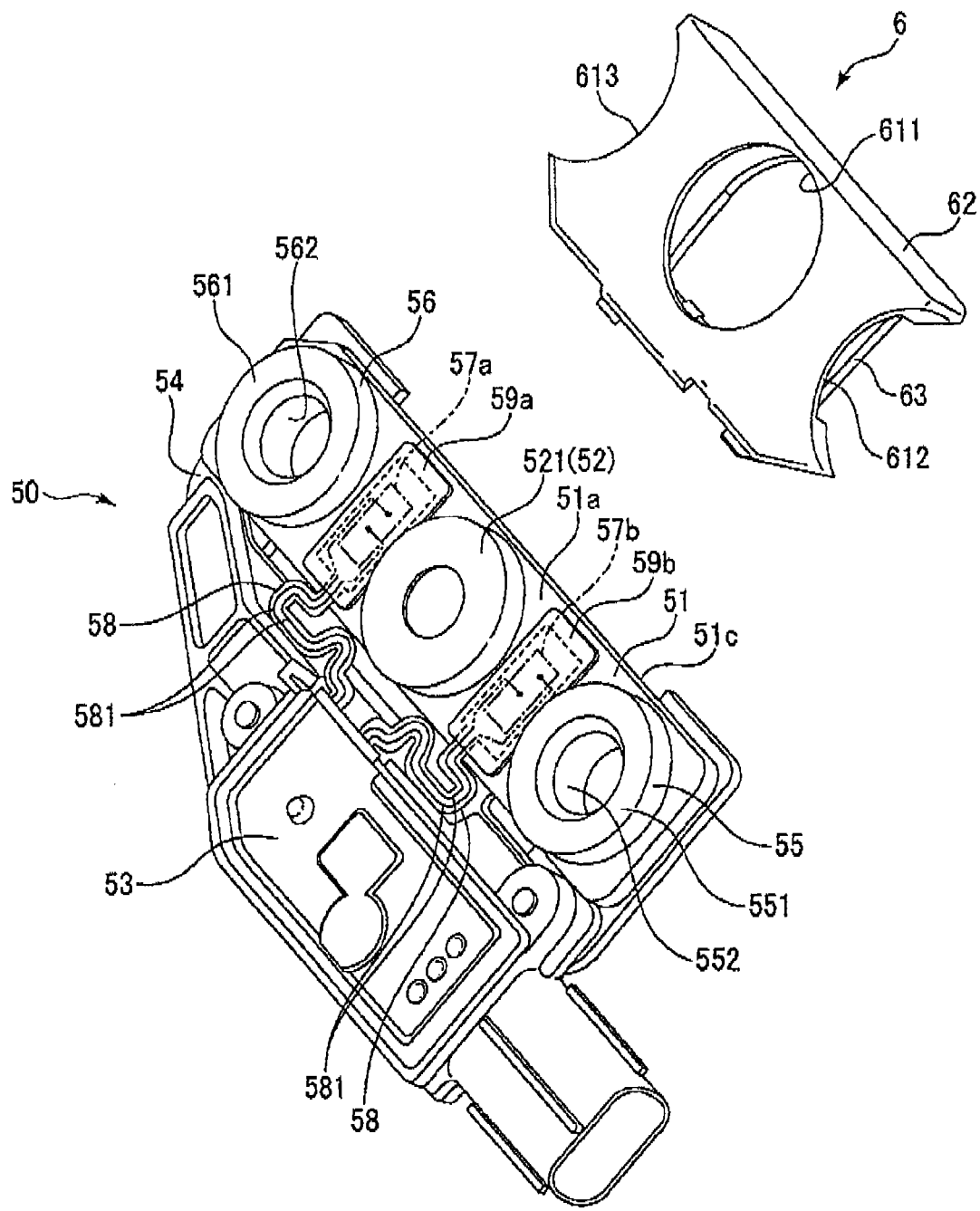
FIG. 6 is an assembling view of the load detection device seen from a bottom of the load detection device according to the embodiment disclosed here.

As shown in FIG. 6, the strain detection element 57a is provided at the bottom surface 51a of the strain member 51 and is placed between the top portion 521 of the load input member 52 and the annular top portion 561 of the fixing member 56. The strain detection element 57b is provided at the bottom surface 51a of the strain member 51 and is placed between the top portion 521 of the load input member 52 and the annular top portion 551 of the fixing member 55. The strain detection elements 57a, 57b detect and measure the flexure of the strain member 51. The flexure amount of the strain member 51 changes in accordance with the load of an occupant or the load applied by an occupant seated in the seat body 2. The flexure amount of the strain member 51 measured by the strain detection elements 57a, 57b is inputted, as signals, to the amplifier circuit contained in the housing 53 via a wire 581 which patterns on the flexible board 58. A connection portion of the strain detection element 57a and the flexible board 58 is covered and protected by a coating portion 59a which is made of resin, for example. A connection portion of the strain detection element 57b and the flexible board 58 is covered and protected by a coating portion 59b which is made of resin, for example. The strain detection elements 57a, 57b and the flexible board 58 are covered with the cover 6 for the load detection sensor 50.

The construction of the cover 6 for the load detection sensor 50 will be explained with reference to FIGS. 7 to 15. The cover 6 for the load detection sensor 50 is made of resin, for example, plastic, and is formed by injection molding, for example. The cover 6 for the load detection sensor 50 is provided with a cover portion 61, a side portion 62, and clamping portions 63, 64. The cover portion 61 covers the strain detection elements 57a, 57b and the flexible board 58. The side portion 62 covers a portion of a side surface of the strain member 51. A set of the clamping portions 63, 64 and the cover portion 61 sandwich respective portions of the load detection sensor 50. The cover portion 61 and the set of clamping portions 63, 64 configuring the cover 6 for the load detection sensor 50 removably sandwich the respective portions of the load detection sensor 50.

Figure 4:
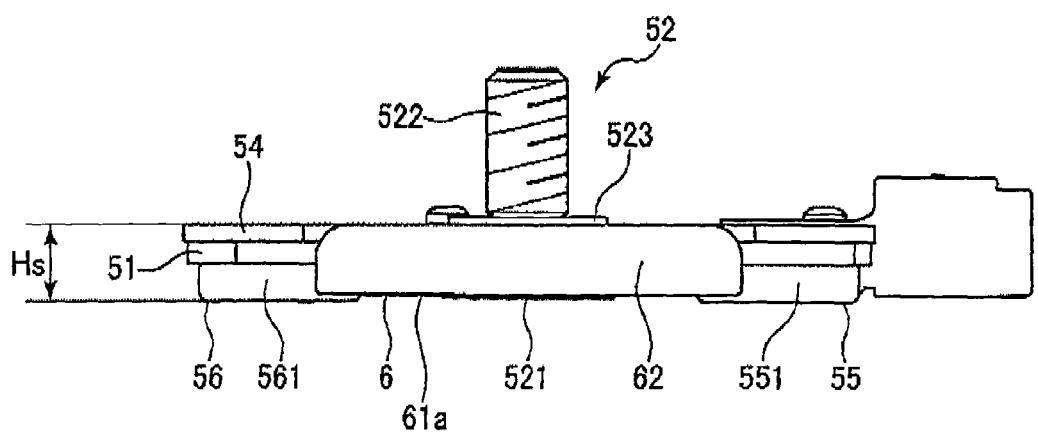
FIG. 4 is a side view of the load detection device of the embodiment.
Figure 5:
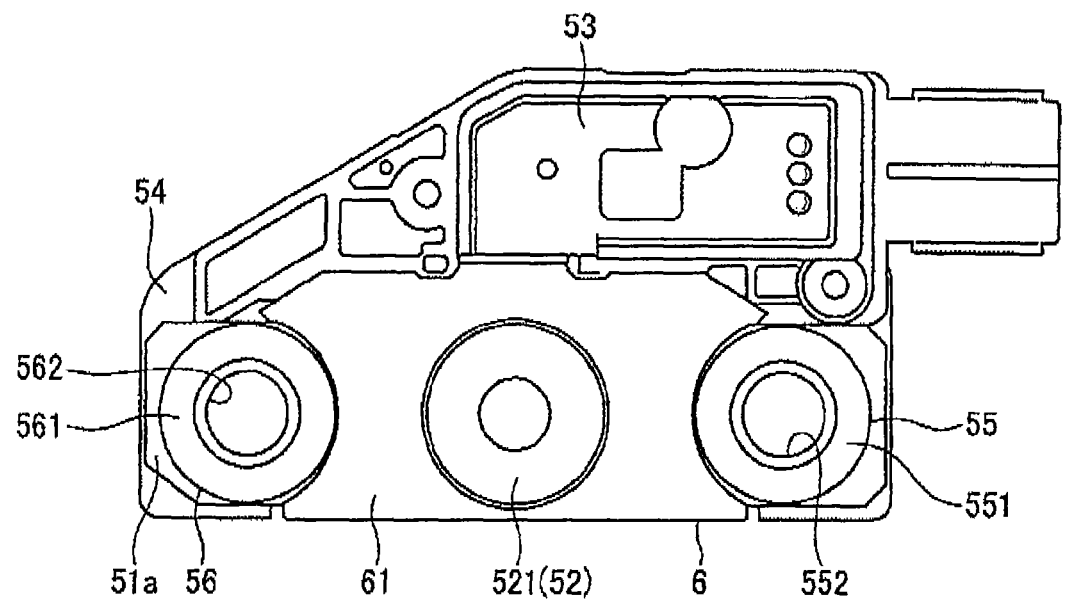
FIG. 5 is a bottom view of the load detection device of the embodiment.
Figure 12:
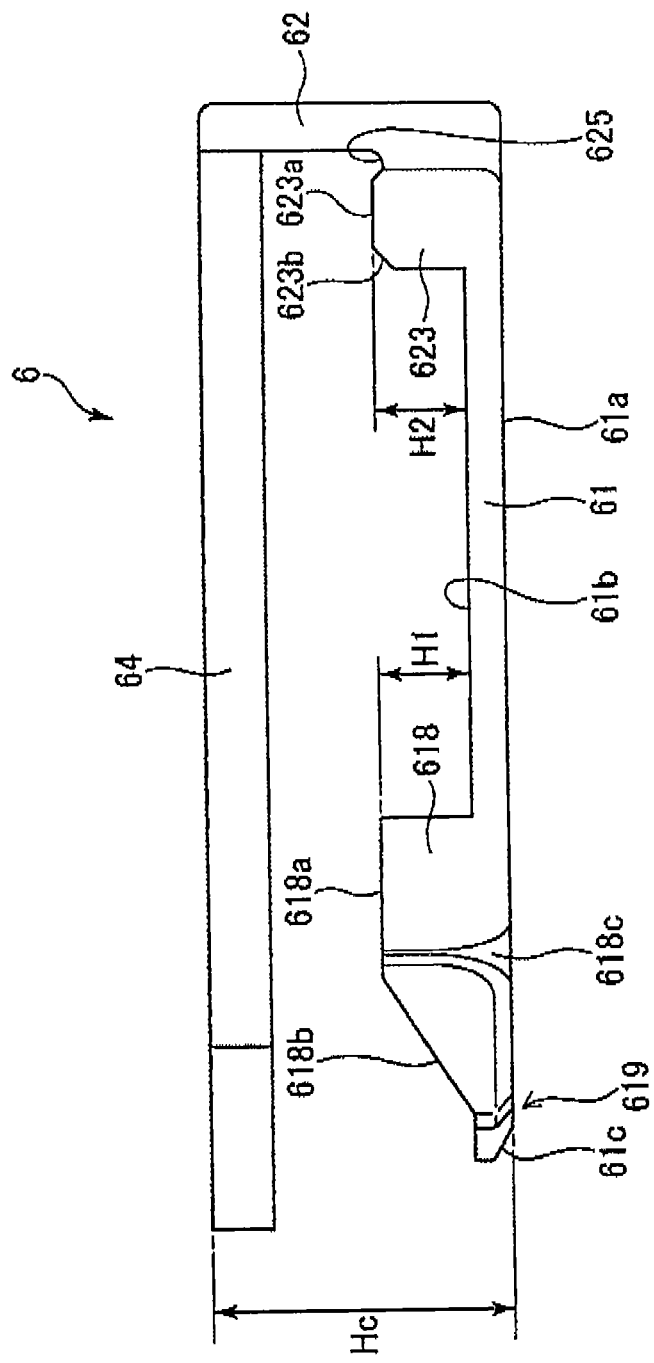
FIG. 12 is a side view of the cover for the load detection sensor according to the embodiment.

As shown in FIGS. 4 and 12, a height Hc of the cover 6 for the load detection sensor 50 is formed to be lower than a height Hs of the load detection sensor 50, that is, the height Hs from the fixing members 55, 56 to the connection plate 54 in a case where the cover 6 for the load detection sensor 50 is attached to the load detection sensor 50. Specifically, the bottom surface 61a of the cover portion 61 is placed higher than respective bottom surfaces of the annular top portions 551, 561 of the fixing members 55, 56 and is placed higher than the top portion 521 of the load input member 52 in a case where the cover 6 for the load detection sensor 50 is attached to the load detection sensor 50. Accordingly, the height of the cover 6 for the load detection sensor 50 is lower than the height of the load detection sensor 50 so that the load detection sensor 50 does not have an influence on mounting to the slide mechanism 3. Thus, any slide mechanism is applicable as long as the load detection sensor 50 can be mounted thereto.

Figure 7:
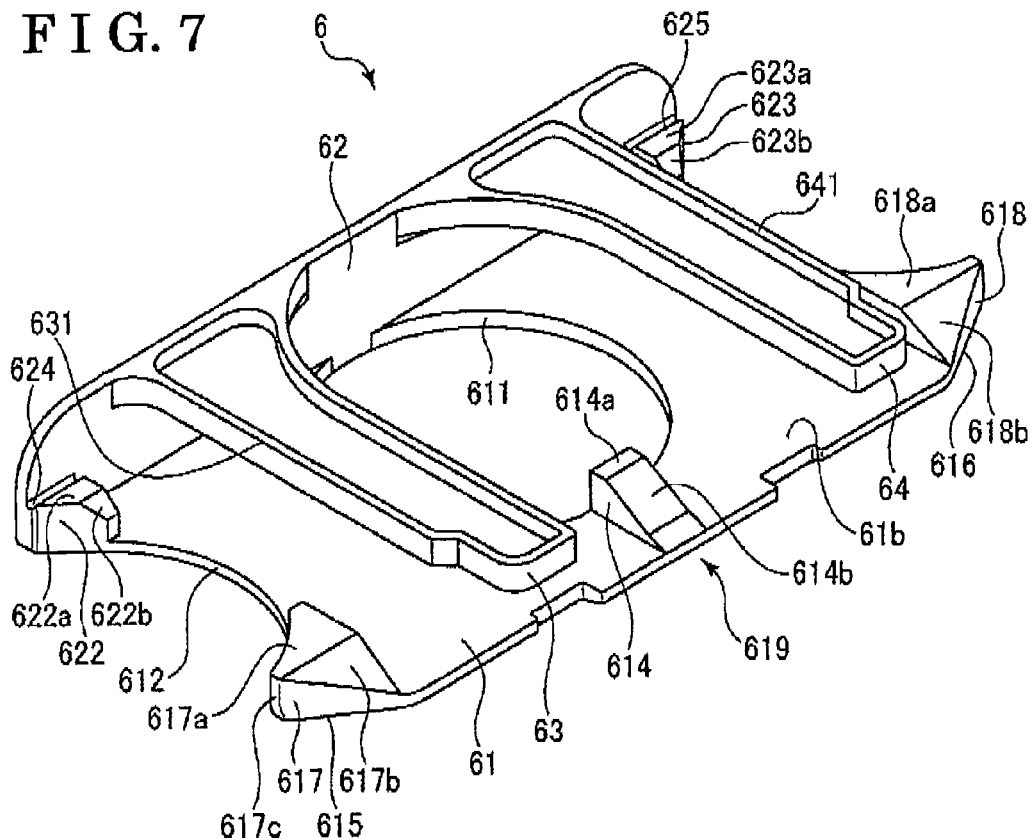
FIG. 7 is a perspective view of a cover for a load detection sensor according to the embodiment.

As shown in FIG. 7, the cover portion 61 includes an opening portion 611, cutout portions 612, 613, a projection portion 614, projections 615, 616, and protruding portions 617, 618. The opening portion 611 disposes the top portion 521 of the load input member 52 within the opening portion 611. The cutout portions 612, 613 face the annular top portions 551, 561 of the fixing members 55, 56, respectively. The projection portion 614 supports the portion of the load detection sensor 50. The projections 615, 616 are formed at opposing end portions of the cutout portions 612, 613, respectively. The protruding portions 617, 618 serve as a pair of protruding portions supporting the portions of the load detection sensor 50, respectively.

The opening portion 611 is disposed at a center portion of the cover portion 61 in the longitudinal direction and is formed to be larger than the top portion 521 of the load input member 52. The diameter of the opening portion 611 corresponds to a size that enables to dispose the top portion 521 within the opening portion 611 in a case where the cover 6 for the load detection sensor 50 is mounted to the load detection sensor 50.

The cutout portion 612 is cut out to correspond to the annular top portion 551 of the fixing member 55. The cutout portion 613 is cut out to correspond to the annular top portion 561 of the fixing member 56. The cutout portion 612 faces a portion of the annular top portion 551 of the fixing member 55, that is, the portion of the annular top portion 551 which is placed close to the strain detection element 57b in a case where the cover 6 for the load detection sensor 50 is attached to the load detection sensor 50. The cutout portion 613 faces a portion of the annular top portion 561 of the fixing member 56, the portion of the annular top portion 561 which is placed close to the strain detection element 57a. Accordingly, the cover portion 61 covers a portion between the top portion 521 of the load input member 52 and the annular top portion 551 of the fixing member 55 and a portion between the top portion 521 of the load input member 52 and the annular top portion 561 of the fixing member 56. In a case where force is applied in a direction separating the cover 6 for the load detection sensor 50 from the load detection sensor 50, the annular top portions 551, 561 retain the cutout portions 612, 613, respectively, so that the cover 6 for the load detection sensor 50 can be prevented from being disengaged from the load detection sensor 50.

The projection portion 614 protrudes from a rim portion of the opening portion 611, which is an insertion side where the load detection sensor 50 is inserted, toward the clamping portions 63, 64. The projection portion 614 is provided with a supporting surface 614a and a tapered surface 614b. The supporting surface 614a faces the clamping portions 63, 64 and supports the portion of the load detection sensor. That is, the supporting surface 614a and the clamping portions 63, 64 support the portion of the load detection sensor. The tapered surface 614b is inclined or tilted downward in a direction away from the opening portion 611.

The projection 615 extends toward a position where the strain detection element 57a and the flexible board 58 are not placed, that is, the projections 615 extends to be away from the strain detection elements 57a and the flexible board 58. The projection 616 extends toward a position where the strain detection element 57b and the flexible board 58 are not placed, that is, the projection 616 extends to be away from the strain detection element 57b and the flexible board 58. The protruding portion 617 protrudes from the projection 615 toward the clamping portion 63. The protruding portion 617 is provided with a first supporting surface 617a and a substantially triangle-shaped tapered surface 617b. The first supporting surface 617a includes a surface facing the clamping portions 63, 64 and supports the portion of the load detection sensor 50. That is, the first supporting surface 617a and the clamping portions 63, 64 support the portion of the load detection sensor. The tapered surface 617b is inclined or tilted downward from the first supporting surface 617a in a direction away from the side portion 62. The protruding portion 618 protrudes from the projection 616 toward the clamping portion 64. The protruding portion 618 is provided with a second supporting surface 618a and a substantially triangle-shaped tapered surface 618b. The second supporting surface 618a includes a surface facing the clamping portions 63, 64 and supports a portion of the load detection sensor 50. That is, the first supporting surface 618a and the clamping portions 63, 64 support the portion of the load detection sensor. The tapered surface 618b is inclined or tilted downward from the second supporting surface 618a in the direction away from the side portion 62. The first and second supporting surfaces 617a, 618a of the protruding portions 617, 618 support the respective portions of the load detection sensor 50 where the strain detection elements 57a, 57b and the flexible board 58 are not placed.

According to the aforementioned construction of the embodiment, the tapered surfaces 617b, 618b slide on respective corner portions of the annular top portions 551, 561 by the application of force from the side portion 62 so as to insert the load detection sensor 50 into the cover 6 for the load detection sensor 50 when the cover 6 for the load detection sensor 50 is attached to the load detection sensor 50. Thus, a clearance provided between the cover portion 61 and the clamping portion 63 and a clearance provided between the cover portion 61 and the clamping portion 64 increase so that the cover 6 for the load detection sensor 50 can be attached to the load detection sensor 50 easily. In addition, because the projection portion 614 includes the tapered surface 614b, the tapered surface 614b is not disturbed by the top portion 521 of the load input member 52. Thus, the load detection sensor 50 can be inserted into the cover 6 for the load detection sensor 50. Accordingly, the operability of the cover 6 for the load sensor 50 is enhanced in a case where the cover 6 for the load detection sensor 50 is attached to the load detection sensor 50.

Figure 13:
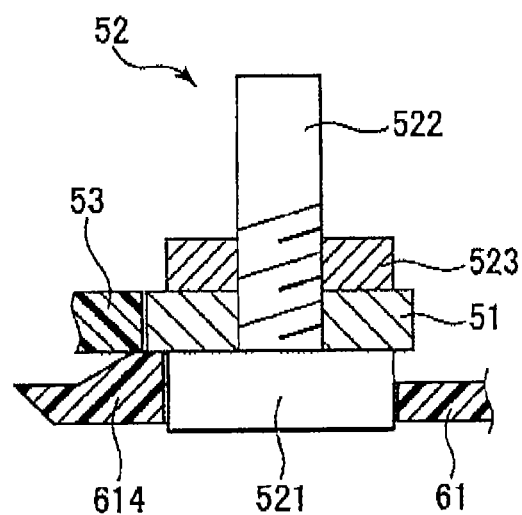
FIG. 13 is a partially enlarged view of a cross section taken along line XIII-XIII in FIG. 3.

As shown in FIG. 13, in a case where force is applied in a direction toward the side portion 62, that is, in a direction removing the cover 6 for the load detection sensor 50 after the cover 6 for the load detection sensor 50 is attached to the load detection sensor 50, the projection portion 614 is retained by the top portion 521 of the load input member 52. Accordingly, the cover 6 for the load detection sensor 50 is prevented from being disengaged from the load detection sensor 50.

The projection portion 614 of the cover portion 61 needs to climb over or override the top portion 521 of the load input member 52 so that the cover 6 for the load detection sensor 50 is pulled to a side where the side portion 62 is disposed in order to detach the load detection sensor 50 from the cover 6 for the load detection sensor 50. In addition, the protruding portions 617, 618 provided at the opposing end portions of the cover portion 61 need to climb over or override the annular top portions 551, 561 of the fixing members 55, 56, respectively so that the cover 6 for the load detection sensor 50 is pulled to a side where the side portion 62 is disposed. Accordingly, tension or stress is needed to be applied in a direction detaching the cover portion 61 from the load detection sensor 50 from two positions placed at a periphery of the cover portion 61. Thus, the cover 6 for the load detection sensor 50 can be easily attached to the load detection sensor 50, however, is difficult to be detached from the load detection sensor 50. Thus, the cover 6 for the load detection sensor 50 is not easily detached from the load detection sensor 50 due to the movement of the upper rail 32 or the inclination or oscillation of the vehicle.

Figure 9:
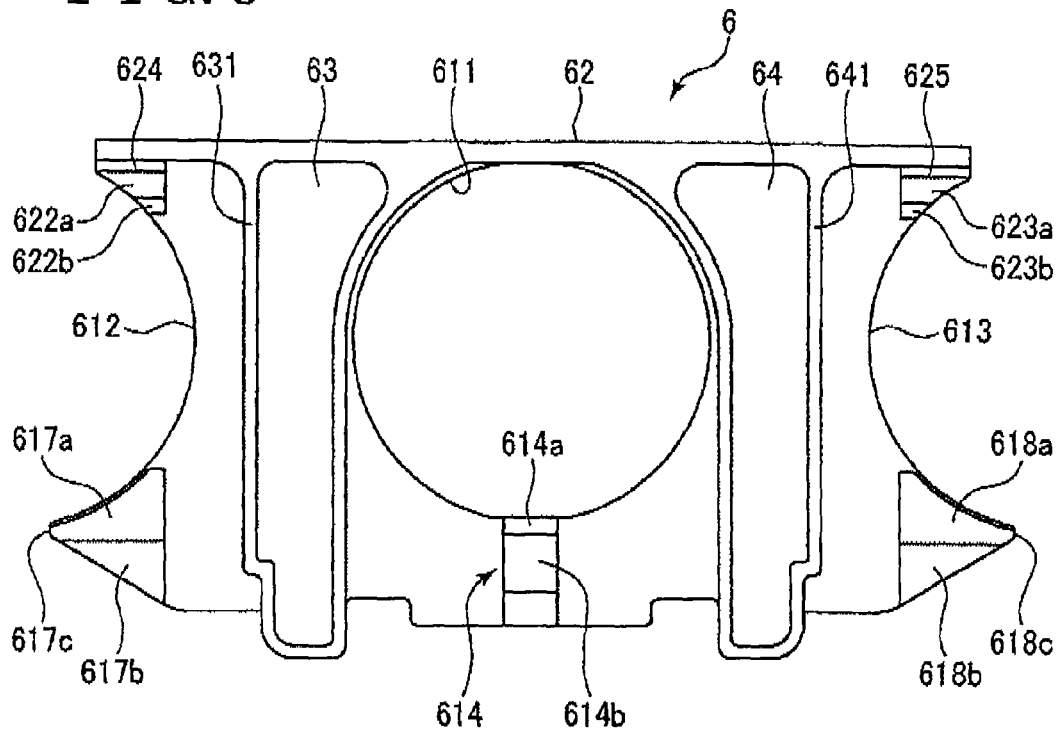
FIG. 9 is a top view of the cover for the load detection sensor according to the embodiment.
Figure 10:
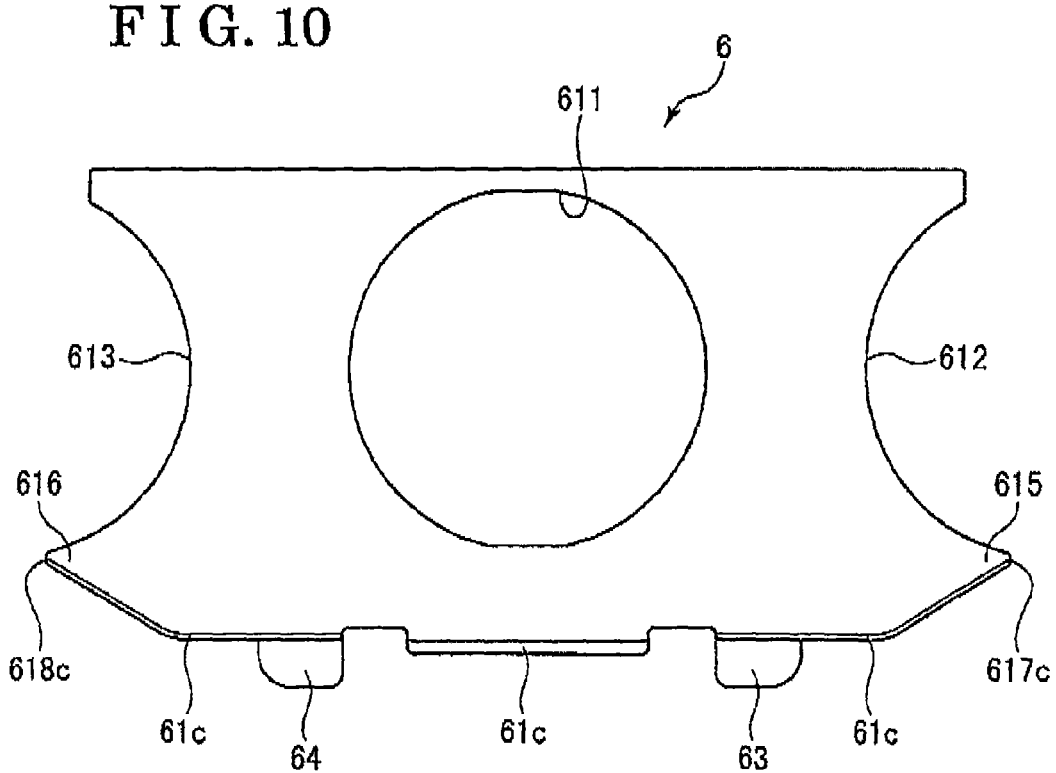
FIG. 10 is a bottom view of the cover for the load detection sensor according to the embodiment.
Figure 14:
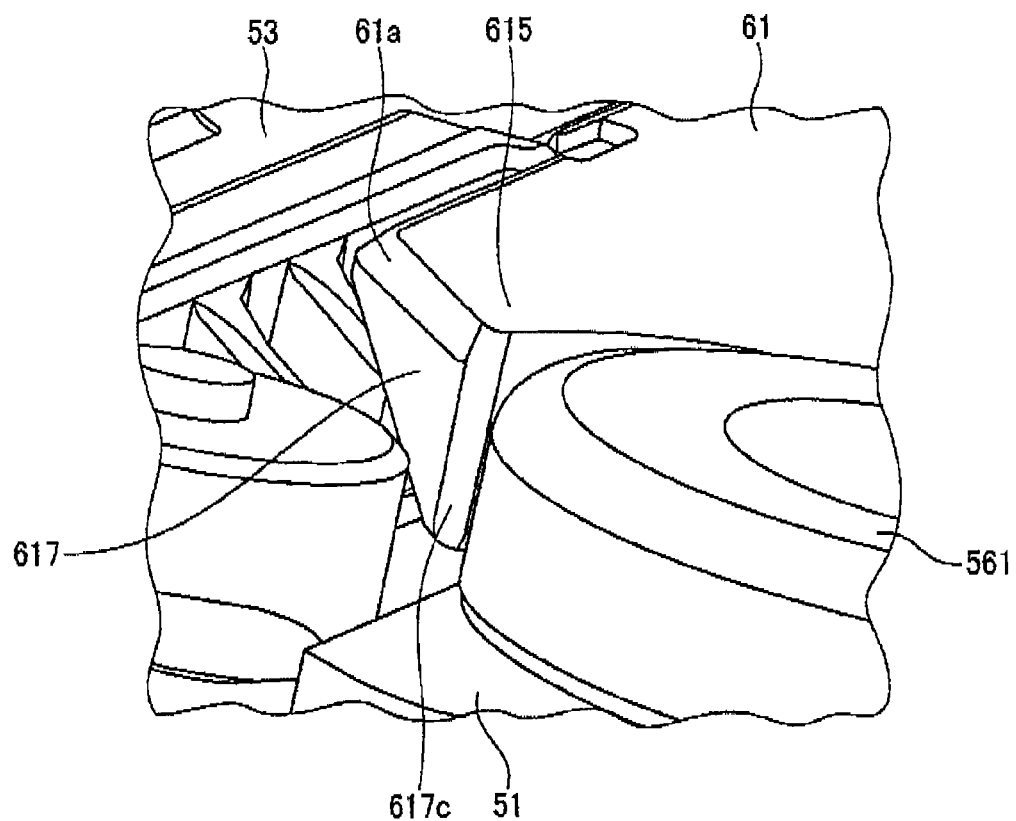
FIG. 14 is a partially enlarged view of the load detection device.

As shown in FIGS. 7 and 9, respective corner portions 617c, 618c of the protruding portions 617, 618 are formed in a curved surface. As shown in FIG. 14, in a case where the cover 6 for the load detection sensor 50 is attached to the load detection sensor 50, the protruding portion 617 functions as a protection wall which prohibits extraneous materials from entering into the cover 6 for the load detection sensor 50. Further, the corner portions 617c, 618c provided at the protruding portions 617, 618 locate extraneous materials away at the periphery of the corner portions 617c, 618c. Thus, the protruding portions 617, 618 prevent extraneous materials from entering into the cover 6 for the load detection sensor 50.

The cover portion 61 and the clamping portions 63, 64 serve as insertion portions in a case where the cover portion 61 for the load detection sensor 50 is attached to the load detection sensor 50. The cover portion 61 is formed such that a clearance provided between an insertion end portion 619 and the housing 53 is minimized. Because the clearance provided among the load input member 52, the housing 53 and the fixing members 55, 56 is covered with the covered portion 61, the flexible board extending toward the housing 53 can be protected.

As shown in FIG. 12, a tapered surface 61c is provided at a rim portion of the insertion end portion 619 of the cover portion 61. The tapered surface 61c is inclined upward from a bottom surface 61a and protruding outward relative to the side portion 62.

The side portion 62 is integrally formed with the cover portion 61 and faces a second side surface of the strain member 51 along the longitudinal direction in a state where the cover 6 for the load detection sensor 50 is attached to the load detection sensor 50. As shown in FIG. 7, the side portion 62 includes step portions 622, 623 serving as a pair of step portions projecting from opposing end portions of the side portion 62 toward the cover portion 62. The step portion 622 is provided with a supporting surface 622a, a tapered surface 622b, and a groove portion 624. The supporting surface 622a supports the strain member 51 in a case where the cover 6 for the load detection sensor 50 is attached to the load detection sensor 50. The tapered surface 622b faces and is inclined downward toward the protruding portion 617. The groove portion 624 is recessed on the step portion 622 and extends along the side portion 62. The step portion 623 is provided with a supporting surface 623a, a tapered surface 623b and a groove portion 625. The supporting surface 623a supports the strain member 51 in a case where the cover 6 for the load detection sensor 50 is attached to the load detection sensor 50. The tapered surface 623b faces and is inclined downward toward the protruding portion 618. The groove portion 625 is recessed on the step portion 623 and extends along the side portion 62. As shown in FIG. 12, A height H1 of each of the protruding portions 617, 618 and a height H2 of each of the step portions 622, 623 are substantially equal to one another and correspond to a height in which the strain member 51 does not come in contact with the upper surface 61b of the cover 61 in a case where the strain member 51 bends in accordance with an application of the load from the load input member 52.

The strain member 51 may come in contact with the tapered surfaces 622b, 623b of the step portions 622, 623 in a case where the cover 6 for the load detection sensor 50 is attached to the load detection sensor 50. In those circumstances, the strain member 51 can reach the side portion 62 because the strain member 51 slides on the tapered surfaces 622b, 623b. Accordingly, the insertability of the load detection sensor 50 is enhanced.

Figure 8:
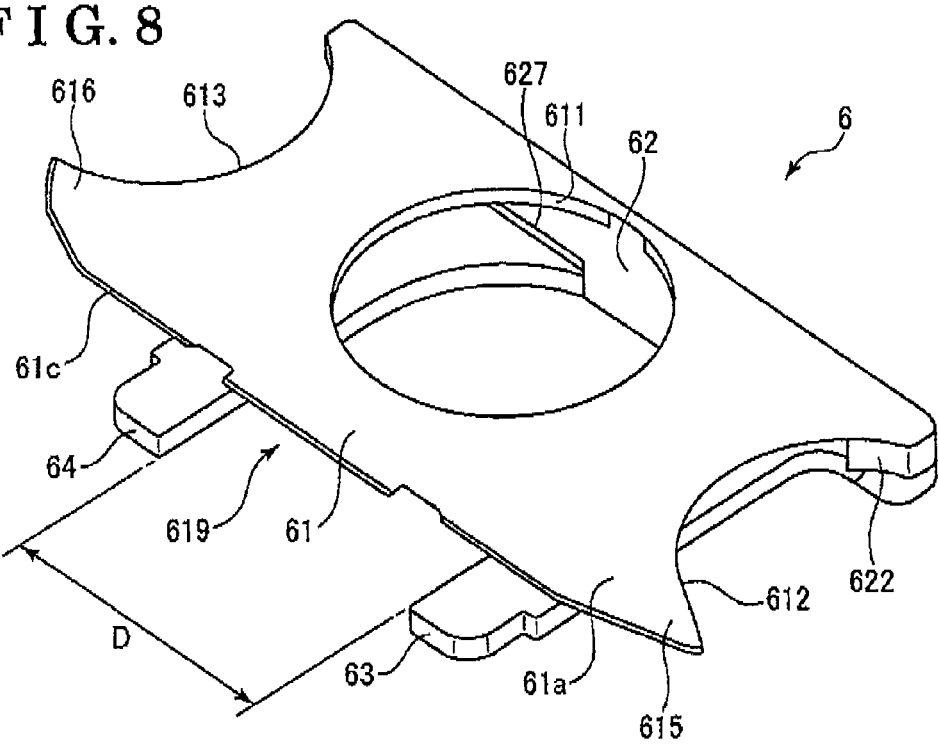
FIG. 8 is a perspective view of the cover for the load detection sensor seen from the bottom of the load detection device according to the embodiment.
Figure 11:
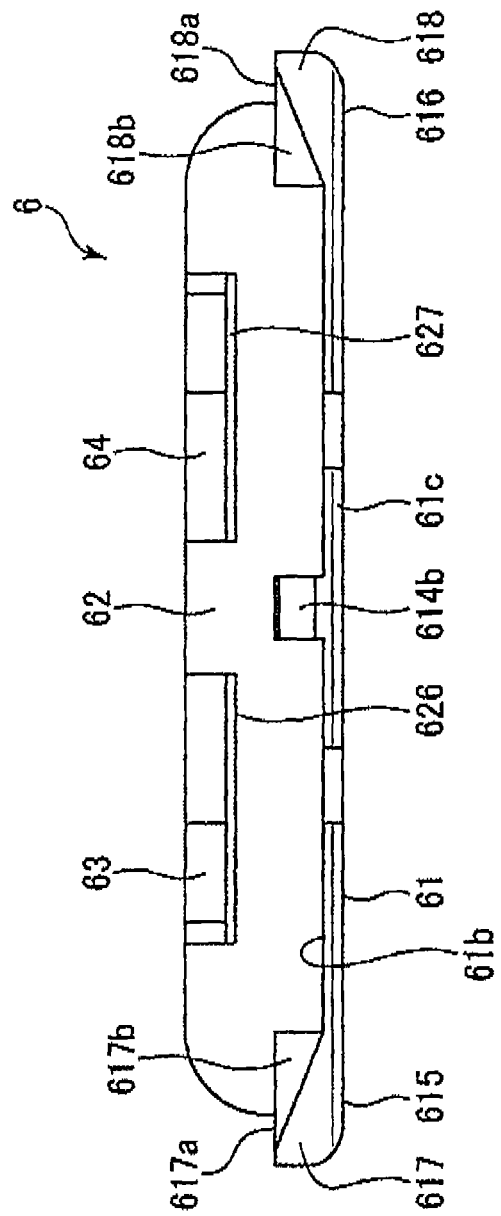
FIG. 11 is a front view of the cover for the load detection sensor according to the embodiment.

The clamping portion 63 is placed between the bracket 523 and the cylinder portion 552 of the fixing member 55. The clamping portion 64 is placed between the bracket 523 and the cylinder portion 562 of the fixing member 56. As shown in FIG. 8, a gap D between the clamping portion 63 and the clamping portion 64 is formed to be larger than the diameter of the bracket 523 which fixes the strain member 51. As shown in FIGS. 7 and 9, upper surfaces of the clamping portions 63, 64 are provided with ribs 631, 641, respectively. The ribs 631, 641 serve as reinforcement members and are disposed at respective peripheries of the clamping portions 63, 64. As shown in FIG. 11, a recessed portion 626 recessed on the side portion 62 which is placed close to a lower surface of the clamping portion 63 and extending along a base portion of the clamping portion 63 is formed. A recessed portion 627 recessed on the side portion 62 which is placed close to a lower surface of the clamping portion 64 and extending along a base portion of the clamping portion 64 is formed.

Figure 15:
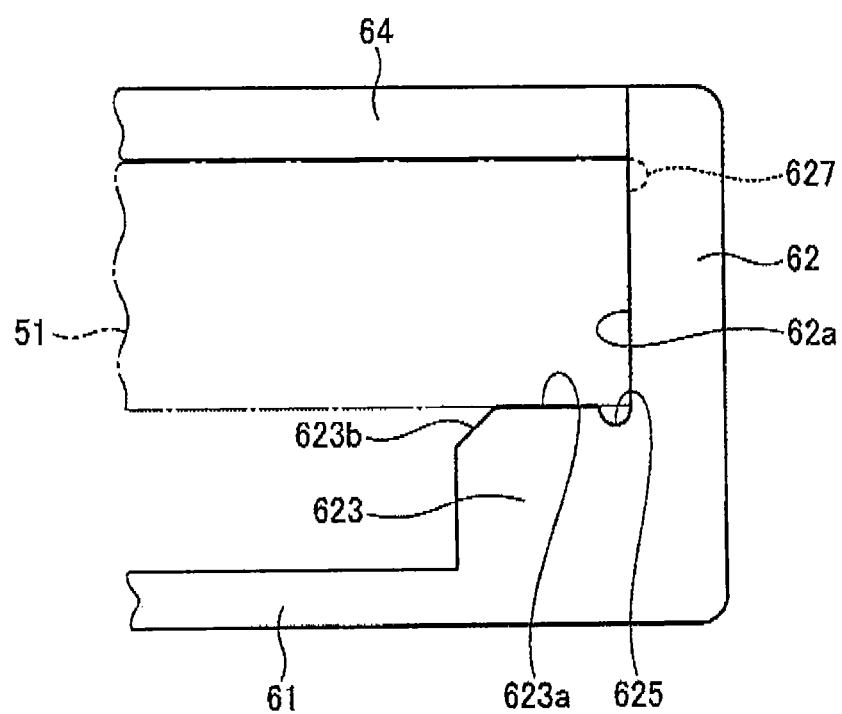
FIG. 15 is a partially enlarged view of a side surface of the cover for the load detection sensor.

As shown in FIG. 15, the groove portions 624, 625 and the recessed portions 626, 627 are provided. The groove portions 624, 625 prevent respective corner portions which are formed by the step portion 622 and the side portion 62 and by the step portion 623 and the side portion 62 from being rounded due to, for example, the contraction of the cover 6 for the load detection sensor 50 while the cover 6 for the load detection sensor 50 is cooled and becomes hard after the injection molding. The recessed portions 626, 627 prevent respective corner portions which are formed by the side portion 62 and the clamping portion 63 and by the side portion 62 and the clamping portion 64 from being rounded due to, for example, the contraction of the cover 6 for the load detection sensor 50 while the cover 6 for the load detection sensor 50 is cooled and becomes hard after the injection molding. Thus, the strain member 51 can be inserted into the cover 6 for the load detection sensor 50 so as to come in contact with an inner wall surface 62a of the side portion 62. Because a clearance formed between the strain member 51 and the inner wall surface 62a of the side portion 62 can be minimized, the insertability of the load detection sensor 50 in a case where the cover 6 for the load detection sensor 50 is attached to the load detection sensor 50 is enhanced. The minimized clearance reduces the size of a clearance formed between the insertion end portion 619 of the cover portion 61 and the housing 53 so that the flexible board 58 may be prevented from a contact in a case where the cover 6 for the load detection sensor 50 is handled by an operator, is on transportation, or is assembled to the vehicle seat 1. In addition, the cover 6 for the load detection sensor 50 may prevent the entering of the extraneous materials.

The load detection device 5 including the cover 6 for the load detection sensor 50 will be explained. The respective portions of the load detection sensor 50 are sandwiched by the supporting surface 614a of the projection portion 614 of the cover portion 6 and the set of clamping portions 63, 64. That is, the load detection sensor 50 is sandwiched by the projection portion 614 and the set of clamping portions 63, 64. The projection portion 614 comes in contact with a center portion of the bottom surface of the load detection sensor 50. The set of clamping portions 63, 64 comes in contact with an upper surface of the load detection sensor 50. The clamping portion 63 extends between the load input member 52 and the fixing member 55. The clamping portion 64 extends between the load input member 52 and the fixing member 56. Because the upper surface of the load detection sensor 50 and a lower surface of the load detection sensor 50 are supported at different positions, that is, the respective supporting positions of the upper surface and of the lower surface are displaced from each other, the load detection sensor 50 can be securely interposed. Thus, noise due to the contact of the cover 6 for the load detection sensor 50 with the load detection sensor 50 in response to the oscillation or swing of the vehicle or the oscillation or swing generated in a case where the seat body 2 is moved by the slide mechanism 3 may be prevented. In addition, the portions of the load detection sensor 50 may be supported by the supporting surfaces 617a, 618a of the protruding portions 617, 618 and the supporting surfaces 622a, 623a of the step portions 622, 623, respectively, so that the load detection sensor 50 may be further securely interposed. Accordingly, the noise may be securely prevented.

The supporting surfaces 617a, 618a of the protruding portions 617, 618 support the respective portions of the load detection sensor 50 including the strain member 51. The supporting surfaces 622a, 623a of the step portions 622, 623 support the strain member 51. Thus, in a case where the strain member 51 is bent in response to a load applied to the load input member 52, the flexure is not disturbed by any factor. That is, because the supporting surfaces 617a, 618a of the protruding portions 617, 618 and supporting surfaces 622a, 623a of the step portions 622, 623 support the strain member 51 at respective positions close to respective sides of the fixing members 55, 56 which face the load input member 52, the flexure of the strain member 51 is not influenced by any factor. Accordingly, a load applied to the load input member 52 is precisely detected by the strain detection elements 57a, 57b.

According to the embodiment, in a case where the cover 6 for the load detection sensor 50 is attached to the load detection sensor 50, the clearance provided among the load input member 52, the housing 53 and the fixing members 55, 56 is covered with the cover portion 61. The cover portion 61 and the clamping portion 63 cooperate with each other to cover the portion of the load detection sensor 50. The cover portion 61 and the clamping portion 64 cooperate with each other to cover the portion of the load detection sensor 50. In particular, the respective portions of the load detection sensor 50 are interposed between the projection portion 614 of the cover portion 61 and the set of clamping portions 63, 64. Accordingly, the whole body of the flexible board 58 is covered with the cover portion 61 so that the flexible board 58 is prevented from being disengaged from the cover 6 for the load detection sensor 50 in a case where the seat body 2 moves on the slide mechanism 3. Thus, the flexible board 58 is continuously protected from coming in contact with the cover 6 for the load detection sensor 50 in a case where the cover 6 for the load detection sensor 50 is handled by an operator, on transportation, or is assembled to the vehicle seat 1 or is continuously protected from extraneous materials.

In a case where force is applied in the direction separating the cover 6 for the load detection sensor 50 from the load detection sensor 50, the projection portion 614 is retained by the top portion 521 of the load input member 52. In addition, the annular top portions 551, 561 of the fixing members 55, 56 retain the cutout portions 612, 613 respectively. Accordingly, the cover 6 for the load detection sensor 50 can be prevented from being disengaged from the load detection sensor 50.

The constructions of the disclosure are not limited to the aforementioned embodiment and various modifications are applied as long as the modifications do not depart from the objective of the disclosure. For example, according to the embodiment, the opening portion 611 is formed in a substantially circular shape. The cutout portions 612, 613 are formed in an arc shape. Alternatively, the opening portion 611 and the cutout portions 612, 613 can be formed to accord with the shapes of the top portion 521 of the load input member 52 and the annular top portions 551, 561 of the fixing members 55, 56.

According to the embodiment, the clamping portions 63, 64 serve as a pair. Alternatively, a single clamping portion is applicable. Similarly, the fixing members 55, 56, the cutout portions 612, 613, the protruding portions 617, 618, and the step portions 622, 623 serve as a pair. Alternatively, a single fixing member, a single cutout portion, a single protruding portion and a step portion are applicable.

According to the aforementioned embodiment, the cover 6 for a load detection sensor 50 removably attached to the load detection sensor 50 includes the sheet-shaped strain member 51, the load input member 52 penetrating the first main surface (the lower surface 51a) of the strain member 51 and the second main surface (the upper surface 51b) of the strain member 51, the load input member 52 receiving the load from the seat for the vehicle (the vehicle seat 1), the strain detection element (57a, 57b) being provided at the first main surface (the lower surface 51a) of the strain member 51, the housing 53 configured to contain the amplifier circuit amplifying the signal from the strain detection element 57a, 57b, the flexible board 58 configured to connect the strain detection element 57a, 57b and the amplifier circuit, at least one fixing member 55, 56 fixing the strain member 51 to the housing 53, the cover portion 61 facing the first main surface (the lower surface 51a) of the strain member 51, the side portion (62) being integrally formed with the cover portion 61 and facing the side surface of the strain member 51, and the clamping portion 63, 64 facing the second main surface 51b of the strain member 51, the clamping portion 63, 64 extending from the side portion 62 toward the housing 53 and covering the clearance provided between the load input member 52 and the fixing member 55, 56, the clamping portion 63, 64 cooperating with the cover portion 61 so that the clamping portion 63, 64 and the cover portion 61 sandwich the load detection sensor 50 therebetween. The cover portion 61 includes the opening portion 611 being formed to correspond to the load input member 52, the cutout portion 612, 613 being formed to correspond to the fixing member 55, 56 and the projection portion 614 protruding from the rim portion of the opening portion 611 and being in contact with the portion of the load detection sensor 50. The cover portion 61 extends over the clearance provided among the housing 53, the load input member 52 and the fixing member 55, 56. The cover 6 for the load detection sensor 50 covers the strain detection element 57a, 57b and the flexible board 58.

According to the embodiment, in a case where the cover 6 for the load detection sensor 50 is attached to the load detection sensor 50, the clearance among the load input member 52, the housing 53 and the fixing members 55, 56 is covered with the cover portion 61. The cover portion 61 and the clamping portion 63 cooperate with each other to cover the portion of the load detection sensor 50. The cover portion 61 and the clamping portion 64 cooperate with each other to cover the portion of the load detection sensor 50. Thus, the load detection sensor 50 is sandwiched by the cover portion 61 and the set of clamping portions 63, 64. Accordingly, the cover 6 for the load detection sensor 50 can be prevented from being disengaged from the load detection sensor 50 in a case of the movement of the vehicle seat 1 or the oscillation or swing of the vehicle. Thus, the flexible board 58 is protected in a case where the cover 6 for the load detection sensor 50 is handled by an operator, on transportation, or is assembled to the vehicle seat 1 or is protected from extraneous materials.

According to the aforementioned embodiment, the cover portion 61 includes the protruding portion 617, 618 protruding from the corner portion 617c, 618c of the cutout portion 612, 613 toward the clamping portion 63, 64, the protruding portion 617, 618 coming in contact with the portion of the load detection sensor 50 at the position close to the housing 53 in a case where the cover 6 for the load detection sensor 50 is attached to the load detection sensor 50.

According to the aforementioned embodiment, the projection portion 614 includes the tapered surface 614b inclined in the direction away from the opening portion 611. The protruding portion (617, 618) includes the tapered surface 617b, 618b extending toward the peripheral rim of the cover portion 61 and being inclined toward the projection portion 614.

According to the aforementioned embodiment, the side portion 62 is formed with the recessed portion 626, 627 being recessed on the side of the side portion 62, the side close to the cover portion 61 relative to the upper portion of the side portion 62, the recessed portion 626, 627 extending along the base portion of the clamping portion 63, 64.

According to the aforementioned embodiment, the side portion 62 includes the step portion 622, 623 projecting to the cover portion 61, the step portion 622, 623 coming in contact with the portion of the strain member 51 in a case where the cover 6 for the load detection sensor 50 is attached to the load detection sensor 50.

According to the aforementioned embodiment, the step portion 622, 623 is formed with the groove portion 624, 625 being recessed on the step portion 622, 623 and extending along the side portion 62.

According to the aforementioned embodiment, the step portion 622, 623 includes the tapered surface 622b, 623b facing the protruding portion 617, 618 and being inclined toward the cover portion 61.

According to the aforementioned embodiment, the clamping portion 63, 64 includes the rib 631, 641 placed at the upper surface of the clamping portion 63, 64 in the vertical direction in a case where the cover 6 for the load detection sensor 50 is attached to the load detection sensor 50, the rib 631, 641 continuously extending over the peripheral rim of the clamping portion 63, 64.

According to the aforementioned embodiment, the cover portion 61 includes the tapered surface 61c placed at the lower surface of the rim portion of the insertion side in the vertical direction in a case where the cover 6 for the load detection sensor 50 is attached to the load detection sensor 50, the insertion side from where the load detection sensor 50 is inserted, the tapered surface 61c inclined outward.

According to the aforementioned embodiment, the corner portion 617c, 618c of the protruding portion 617, 618 is formed in the curved shape.

According to the aforementioned embodiment, the fixing members 55, 56 fix the strain member 51 to the housing 53 at opposing end portions of the strain member 51. According to the aforementioned embodiment, the load detection device 5 including the cover 6 for the load detection sensor 50 removably attached to the load detection sensor 50 includes the load detection sensor 50 including the sheet-shaped strain member 51, the load input member 52 penetrating the first main surface (the lower surface 51*a*) of the strain member 51 and the second main surface (the upper surface 51*b*) of the strain member 51, the load input member 52 receiving the load from the seat for the vehicle (the vehicle seat 1), the strain detection element (57*a*, 57*b*) being provided at the first main surface (the lower surface 51*a*) of the strain member 51, the housing 53 configured to contain the amplifier circuit amplifying the signal from the strain detection element 57*a*, 57*b*, the flexible board 58 configured to connect the strain detection element 57*a*, 57*b* and the amplifier circuit, at least one fixing member 55, 56 fixing the strain member 51 to the housing 53, the cover portion 61 facing the first main surface (the lower surface 51*a*) of the strain member 51, the side portion (62) being integrally formed with the cover portion 61 and facing the side surface of the strain member 51, and the clamping portion 63, 64 facing the second main surface 51*b* of the strain member 51, the clamping portion 63, 64 extending from the side portion 62 toward the housing 53 and covering the clearance provided between the load input member 52 and the fixing member 55, 56, the clamping portion 63, 64 cooperating with the cover portion 61 so that the clamping portion 63, 64 and the cover portion 61 sandwich the load detection sensor 50 therebetween. The cover portion 61 includes the opening portion 611 being formed to correspond to the load input member 52, the cutout portion 612, 613 being formed to correspond to the fixing member 55, 56 and the projection portion 614 protruding from the rim portion of the opening portion 611 and being in contact with the portion of the load detection sensor 50. The cover portion 61 extends over the clearance provided among the housing 53, the load input member 52 and the fixing member 55, 56. The cover 6 for the load detection sensor 50 covers the strain detection element 57*a*, 57*b* and the flexible board 58.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

The invention claimed is:

1. A cover for a load detection sensor removably attached to the load detection sensor, comprising:
a sheet-shaped strain member;
a load input member penetrating a first main surface of the strain member and a second main surface of the strain member, the load input member receiving a load from a seat for a vehicle;
a strain detection element being provided at the first main surface of the strain member;
a housing configured to contain an amplifier circuit amplifying a signal from the strain detection element;
a flexible board configured to connect the strain detection element and the amplifier circuit;
at least one fixing member fixing the strain member to the housing;
a cover portion facing the first main surface of the strain member;
a side portion being integrally formed with the cover portion and facing a side surface of the strain member; and
a clamping portion facing the second main surface of the strain member, the clamping portion extending from the side portion toward the housing and covering a clearance provided between the load input member and the fixing member, the clamping portion cooperating with the cover portion so that the clamping portion and the cover portion sandwich the load detection sensor therebetween; wherein
the cover portion includes
an opening portion being formed to correspond to the load input member;
a cutout portion being formed to correspond to the fixing member; and
a projection portion protruding from a rim portion of the opening portion and being in contact with a portion of the load detection sensor; and
the cover portion extends over a clearance provided among the housing, the load input member and the fixing member, the cover for the load detection sensor covers the strain detection element and the flexible board.

2. The cover for the load detection sensor according to claim 1, wherein the cover portion includes a protruding portion protruding from a corner portion of the cutout portion toward the clamping portion, the protruding portion coming in contact with a portion of the load detection sensor at a position close to the housing in a case where the cover for the load detection sensor is attached to the load detection sensor.

3. The cover for the load detection sensor according to claim 2, wherein
the projection portion includes a tapered surface inclined in a direction away from the opening portion; and
the protruding portion includes a tapered surface extending toward a peripheral rim of the cover portion and being inclined toward the projection portion.

4. The cover for the load detection sensor according to claim 1, wherein the side portion is formed with a recessed portion being recessed on a side of the side portion, the side close to the cover portion relative to an upper portion of the side portion, the recessed portion extending along a base portion of the clamping portion.

5. The cover for the load detection sensor according to claim 1, wherein the side portion includes a step portion projecting to the cover portion, the step portion coming in contact with a portion of the strain member in a case where the cover for the load detection sensor is attached to the load detection sensor.

6. The cover for the load detection sensor according to claim 5, wherein the step portion is formed with a groove portion being recessed on the step portion and extending along the side portion.

7. The cover for the load detection sensor according to claim 5, wherein the step portion includes a tapered surface facing the protruding portion and being inclined toward the cover portion.

8. The cover for the load detection sensor according to claim 1, wherein the clamping portion includes a rib placed at an upper surface of the clamping portion in a vertical direction in a case where the cover for the load detection sensor is attached to the load detection sensor, the rib continuously extending over a peripheral rim of the clamping portion.

9. The cover for the load detection sensor according to claim 1, wherein the cover portion includes a tapered surface placed at a lower surface of a rim portion of an insertion side in a vertical direction in a case where the cover for the load detection sensor is attached to the load detection sensor, the insertion side from where the load detection sensor is inserted, the tapered surface inclined outward.

10. The cover for the load detection sensor according to claim 1, wherein the corner portion of the protruding portion is formed in a curved shape.

11. The cover for the load detection sensor according to claim 1, wherein the fixing members fix the strain member to the housing at opposing end portions of the strain member.

12. A load detection device including a cover for a load detection sensor removably attached to the load detection sensor, comprising:
   the load detection sensor including
      a sheet-shaped strain member;
      a load input member penetrating a first main surface of the strain member and a second main surface of the strain member, the load input member receiving a load from a seat for a vehicle;
      a strain detection element being provided at the first main surface of the strain member;
      a housing configured to contain an amplifier circuit amplifying a signal from the strain detection element;
      a flexible board configured to connect the strain detection element and the amplifier circuit;
      at least one fixing member fixing the strain member to the housing;
   a cover portion facing the first main surface of the strain member;
   a side portion being integrally formed with the cover portion and facing a side surface of the strain member; and
   a clamping portion facing the second main surface of the strain member, the clamping portion extending from the side portion toward the housing and covering a clearance provided between the load input member and the fixing member, the clamping portion cooperating with the cover portion so that the clamping portion and the cover portion sandwich the load detection sensor therebetween; wherein
the cover portion includes
   an opening portion being formed to correspond to the load input member;
   a cutout portion being formed to correspond to the fixing member; and
   a projection portion protruding from a rim portion of the opening portion and being in contact with a portion of the load detection sensor; and
the cover portion extends over a clearance provided among the housing, the load input member and the fixing member, the cover for the load detection sensor covers the strain detection element and the flexible board.

* * * * *